United States Patent [19]
Shaw et al.

[11] Patent Number: 5,823,316
[45] Date of Patent: Oct. 20, 1998

[54] METHOD FOR AUTOMATIC CONVEYOR WIDTH ADJUSTMENT

[75] Inventors: Michael F. Shaw, Sunrise; Anthony J. Suppelsa, Coral Springs; Richard W. Jones, Lauderhill, all of Fla.

[73] Assignee: Motorola, Inc., Schaumburg, Ill.

[21] Appl. No.: 538,931

[22] Filed: Oct. 4, 1995

[51] Int. Cl.⁶ ................................................. B65G 43/00
[52] U.S. Cl. ....................... 198/341; 198/502.2; 198/817; 29/714
[58] Field of Search ................................. 198/341, 502.2, 198/817, 836.3; 29/714, 759, 822, 823, 833

[56] References Cited

U.S. PATENT DOCUMENTS

| | | | |
|---|---|---|---|
| 4,419,384 | 12/1983 | Kane et al. | 198/341 |
| 4,454,939 | 6/1984 | Kampf et al. | 198/341 |
| 4,631,812 | 12/1986 | Young | 198/817 |
| 5,437,359 | 8/1995 | Maruyama et al. | 198/341 |

Primary Examiner—Joseph E. Valenza
Attorney, Agent, or Firm—Dale W. Dorinski

[57] ABSTRACT

A computer controlled assembly line (10) contains multiple work cells (40) for assembling a printed circuit board (PCB). Each work cell contains a conveyor (30) that can independently adjust its width, and the work cells are arranged to process the printed circuit board within the cell. The work cells are arranged so that they can pass the printed circuit board from the conveyor in one work cell to the conveyor in the next cell. The conveyors have two parallel rails (35, 36) situated so that the distance between the rails can be automatically adjusted to accommodate printed circuit boards of varying widths on the same assembly line at the same time. Each work cell independently adjusts the width of its conveyor (i.e. the distance between the rails) to accommodate the incoming printed circuit board. When the PCB is cleared out of the first cell, a second PCB waiting to enter the first cell is scanned (20), and the conveyor width of the first cell is re-adjusted to accommodate the different size of the first PCB. The entire assembly line is controlled by a central controller, such as a computer.

8 Claims, 3 Drawing Sheets

METHOD FOR AUTOMATIC CONVEYOR WIDTH ADJUSTMENT

TECHNICAL FIELD

This invention relates in general to conveying systems, and in particular to computer controlled conveying systems having independently adjustable widths.

BACKGROUND

Historically, assembly lines in the electronic industry have been configured to process product of a single size. A pallet of a standard pre-selected size was used, and the product was contained within the perimeter of the pallet, since the widths of the conveyor could not be easily changed. In this way, differing sized products could then be processed on the same assembly line. The problem with this approach is that the various sizes and styles of pallets needed to accommodate the differing product sizes can be quite large, and the pallets can be quite expensive. This leads to an expensive inventory of pallets that must be stocked, and the pallets are subject to wear and tear, requiring constant maintenance.

Some have attempted to alleviate this situation by making a 'pallet-less' conveyor system. This system processes the product directly on the conveyor line, but again is limited to product of a single size.

Still others have attempted to make the conveyor adjustable to accommodate products of varying sizes. The problem with this approach is that the adjustment of the conveyors is a manual operation, and requires that all the product running on the entire system be purged from the assembly line before an adjustment can be made. This means that one must run product sizes in a large 'batch' mode, thus effectively precluding much variation in the product mix.

It would be desirable to be able to run multiple sized product on the electronics assembly line at the same time, thus enabling a 'batch of one' concept where an infinitely variable mix and match of product sizes could be accommodated. This would eliminate the need for expensive pallets and lower the overall cost of production.

DETAILED DESCRIPTION OF THE PREFERRED EMBODIMENT

Figure 1:
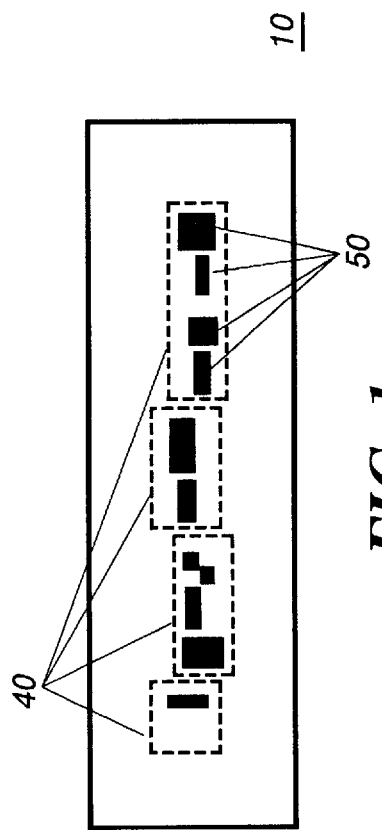
FIG. 1 is a representation of an assembly line with multiple work cells or zones.
Figure 2:
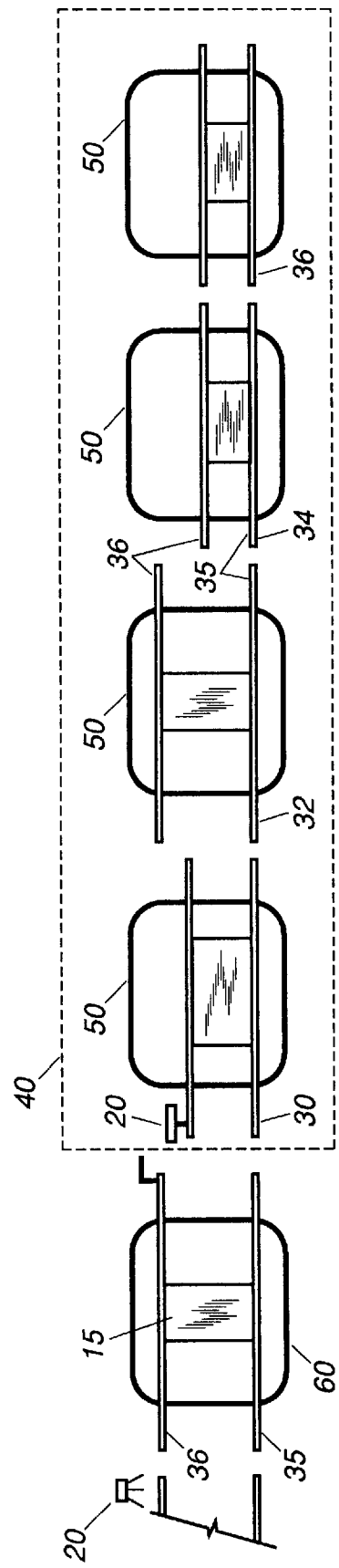
FIG. 2 is a representation showing multiple work cells, each having an independently controlled conveyor width.

While the specification concludes with claims defining the features of the invention that are regarded as novel, it is believed that the invention will be better understood from a consideration of the following description in conjunction with the drawing figures. Referring now to FIGS. 1 and 2, a computer controlled assembly line 10 contains multiple zones 40 for assembling an electronic device on a printed circuit board (PCB) 23. Within each zone 40 is a plurality of work cells 50, and each work cell contains a conveyor 30, 32, 34, 36 that can independently adjust its width. The various zones and work cells are situated so that they can perform a process on the printed circuit board within the cell, or pass the printed circuit board from the conveyor in one work cell to the conveyor in the next cell. The conveyors have two parallel rails 35, 37 situated so that the distance between the rails can be automatically adjusted to accommodate printed circuit boards of varying widths on the same assembly line at the same time. Immediately preceding each zone 40 is a machine 60 such as a solder printer, high speed chip placement machine, reflow oven, or other type of equipment that has its own self-controlled conveyor. An optical scanner 21 near the input end of the machine 60 acquires information relating to the size and type of the printed circuit board 23 prior to the board entering the machine, and this information is used to adjust the distance between the conveyor rails in the machine. The machine 60 then performs its function on the workpiece 23, and the workpiece is then transferred out of the machine and into the first or 'master' conveyor 30 in the master work cell. When the processing step in that ell is complete, a signal is sent to the next conveyor (the 'slave' conveyor) 32 in the zone, and that conveyor adjusts its width (i.e. the distance between the rails) to accommodate the incoming printed circuit board. The board then exits the master cell and is transported to the slave cell on the newly adjusted conveyor. When the PCB is cleared out of the master cell, a second PCB waiting to enter the first cell has been scanned, and the master conveyor width is again adjusted to accommodate the different size of this second PCB. A multiplicity of conveyors are in the assembly line, and each zone can simultaneously process a PCB that is of a different size than the PCB in the adjacent cell. The entire assembly line is controlled by a central controller, such as a computer.

This conveyor system processes the product on the assembly line by interfacing with the computer integrated manufacturing (CIM) system. It accomplishes this by identifying the products on the line using bar code labels, laser scanners and computer control. The conveyors configure their widths automatically (i.e. without human intervention) to accommodate PCBs with widths between 3 inches and 12 inches. The system is unique in that the bar code scanning, CIM interface and conveyor width adjusting features have been incorporated into the conveyor control software. The conveyor width operation also uses a computer network for conveyor-to-conveyor communications. All of this enables the conveyor system to perform a controlled width change by using a feedback loop from one of the work cells. A detailed description of one embodiment of the invention will now be described. These operations are controlled by a rack mounted Programmable Logic Controller (PLC) inside the conveyor. Information is transmitted from the scanner to the PLC and then to the CIM controller via RS232 communication. The product build begins as PCB panels are introduced at the beginning of the line. A bar code, which is part of the circuit artwork on the first side of a panel, is read by a bar code camera system. When the bar code is read, a unique identification number is generated which contains the date, the product type and the size of the PCB being processed, and a label is printed by a printer within the cell. The label is affixed to the edge of the panel, and the PCB then travels to each of the processes on the assembly line. The panels are first printed with solder paste using conventional technology well known to those skilled in the art. A bar code scanner mounted at the entrance to the printer reads the bar code label attached to the PCB or workpiece. CIM the uses the bar code information to configure the machine (such as a high speed chip placement machine, a robot, a solder paste printer, etc.) for that particular product. The widths for each of the conveyors located after the machine are automatically adjusted when the machine conveyor width adjusts using a technique called "follow the leader".

Figure 3:
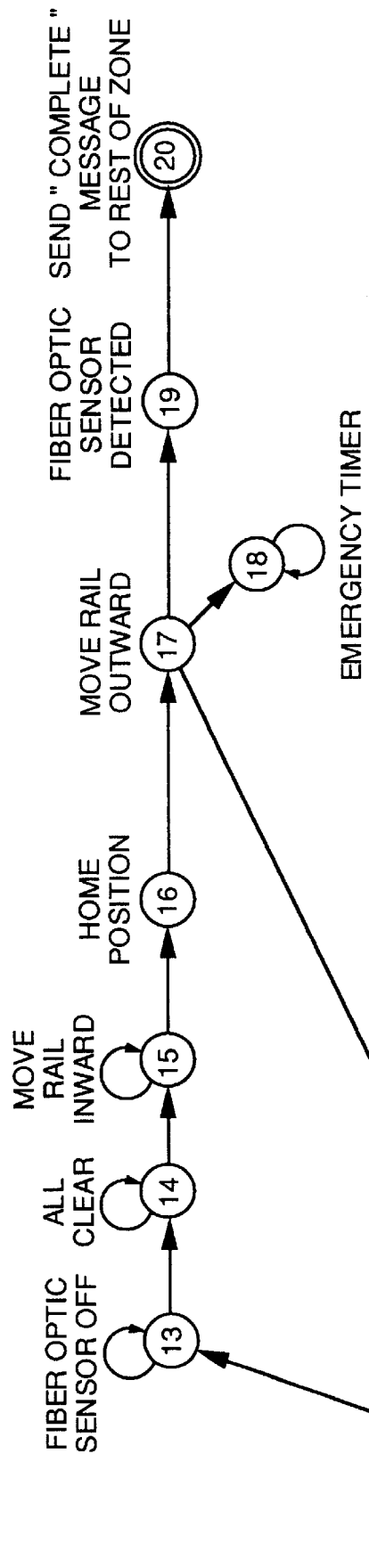
FIG. 3 is a state diagram for a master conveyor in accordance with the invention.
Figure 4:
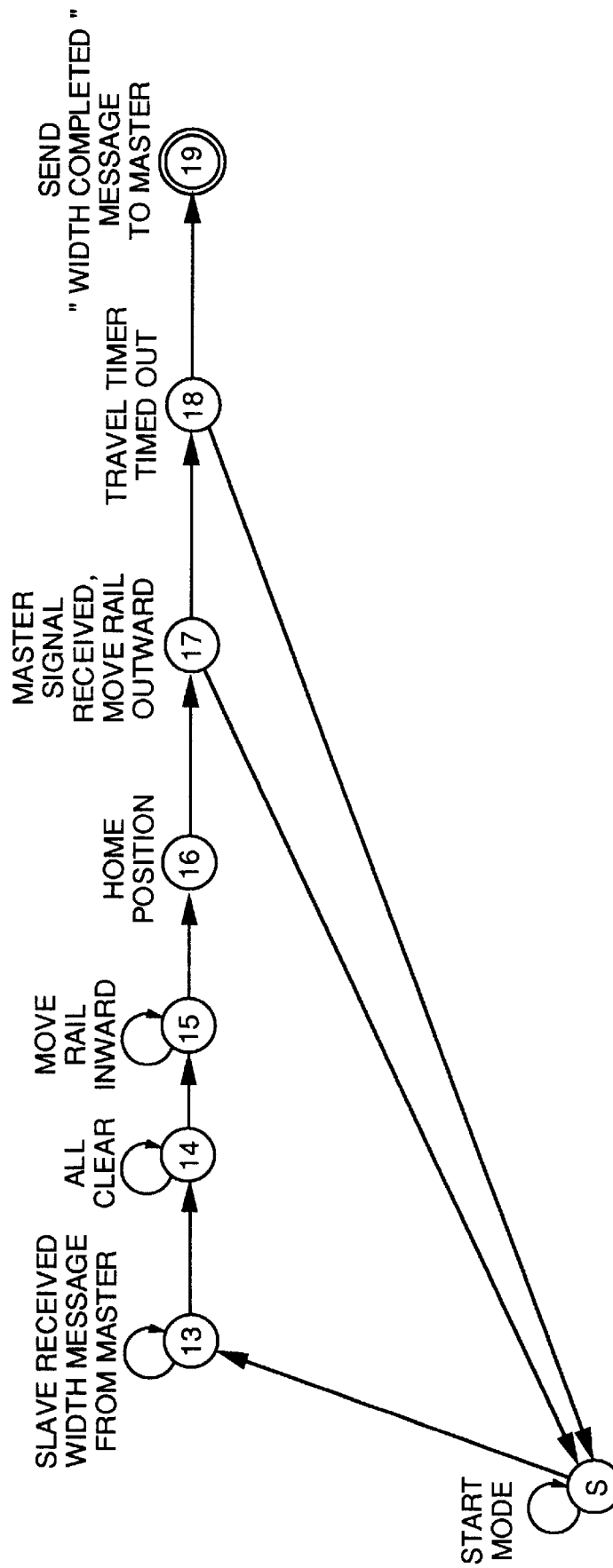
FIG. 4 is a state diagram for a slave conveyor in accordance with the invention.

Referring additionally to the state diagrams of FIGS. 3 and 4, the conveyor width is changed automatically by the CIM system. Then any time the previous work cell conveyor width changes, the master conveyor width will change about 2 seconds later. A conveyor will not change width unless it is in the Start State. The conveyors within a zone are defined as either a master conveyor or a slave conveyor. There is only one master conveyor 30 in each zone 40, and the remaining conveyors in that zone are slave conveyors 32, 34, and 36. The width of all the conveyors in a zone can be changed by changing the width setting on the master conveyor. The master checks for the presence of a signal from the fiber optic sensor 22 mounted on the conveyor rail at the entrance to the zone. This sensor is used to detect a flag 24 which is mounted on the machine 60 conveyor rail. If the signal from the fiber optic sensor disappears (turns off) 13, the conveyor will begin an automatic sequence to determine the new conveyor width. This sequence will begin when the "all clear" output state is set 14. Then, the conveyor rail moves inward 15 towards the "home" position 16. Once the home position is reached, the rail stops moving, and the position is reset. The rail then begins moving outward 17 toward the new position, until the fiber optic sensor 22 detects the new flag location 19, or until the emergency timer has timed out 18. Once the width of the master conveyor has been set, a "complete" signal is sent 20 to the slaves, and they then initiate a similar action to set their respective widths. The operation and adjustment of the slave conveyors is shown in FIG. 4, and is very much like that of the master, however, they differ in how they are triggered into action. Whereas the master conveyor 30 is triggered by the adjusted width of the conveyor immediately preceding it (that is, triggered by the position of the flag 24 on the conveyor rail in the machine 60 immediately preceding the master conveyor), the slaves are triggered by a signal sent from the master, rather than by a sensor. That is, the master sends a signal 13 to the slaves, the signal containing all the information that is needed to control the operation of the adjustment means (i.e. the stepper motors) in each slave. For example, having determined how many stepper motor pulses are required to move the master to the desired location, the slaves now activate their stepper motors an equivalent number of pulses, so that all conveyors in the zone are exactly the same width. This, of course assumes that the all clear state 14 has been achieved by the slave, indicating that there are no PCBs or workpieces on the slave.

In summary, the instant invention allows multiple sized product to be automatically fabricated on the same assembly line, without human intervention. The system works with defined zones within the factory which span from one machine up to, but not including, the next machine. The first conveyor 30 in the zone 40 is the "master" and is used to identify and track adjustments made to the machine conveyor 60 width when a setup change occurs. This master is equipped with an optical infrared sensor 22 mounted on the entrance rail, which is used to detect a flag 24 which is mounted on the machine conveyor rail. As long as the sensor 22 and flag 24 are in line and the sensor detects the flag, nothing happens, but when a machine conveyor width adjustment is made, the sensor and the flag are no longer in line. If there is no product in the master conveyor, then after a short time delay the conveyor rails begin moving inward towards the home proximity sensor. Once at the home sensor, the rails then begin moving outward until it detects the flag on the work cell rail. The master conveyor essentially follows the width adjustments of the machine conveyor and, hence, the name "follow the leader". The distance that the master conveyor rails traveled is then broadcast to the slave or second conveying means 32 and the other slave conveyors over the network. They then move to this distance, provided that there is no product on their conveyors. When the configuration has been completed, the CIM controller then tells the conveyor to send the product into the waiting work cell. Pallets are eliminated, and the CIM system controls the movement and adjustment of the conveyor rails to accommodate different sized product. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of simultaneously processing workpieces of varying size through a computer controlled conveyor line having multiple cells, comprising the steps of:

scanning a first workpiece to acquire information describing an attribute of the first workpiece;

transmitting the acquired information to a controller;

transmitting the acquired information from the controller to a machine;

adjusting the width of a machine conveyor responsive to the transmitted information;

transporting the first workpiece into the machine on the adjusted machine conveyor;

adjusting the width of a master conveyor in a master work cell by aligning a sensor on the master conveyor with an indicia on the adjusted machine conveyor to match the adjusted width of the machine conveyor;

transporting the first workpiece off of the machine conveyor; and transporting the first workpiece into the master work cell on the adjusted master conveyor.

2. The method as described in claim 1, further comprising the following steps that occur after the step of transporting the first workpiece into the master work cell:

scanning a second workpiece to acquire second information describing an attribute of the second workpiece; and transmitting the acquired second information to the controller, and subsequently to the machine conveyor.

3. The method as described in claim 2, further comprising a step, after the step of transporting the first workpiece off of the machine conveyor, of adjusting the width of the machine conveyor responsive to the transmitted second information.

4. The method as described in claim 1, further comprising a step, after the step of adjusting the width of the master conveyor, of adjusting the width of a slave conveyor in a slave work cell responsive to a signal from the master work cell.

5. The method as described in claim 4, further comprising a step, after the step of adjusting the width of the slave conveyor, of transporting the first workpiece out of the master work cell into the slave work cell.

6. The method as described in claim 1, wherein the step of scanning comprises scanning with a bar code scanner.

7. A computer controlled assembly line having multiple independently adjustable-width conveyors, comprising:

sensing means for sensing the size of a workpiece;

a machine having an adjustable width conveyor comprising first and second parallel conveying means, the distance between the first and second conveying means adjusted to a first width in response to the sensing means to accommodate the workpiece;

a work cell containing a conveyor having third and fourth parallel conveying means, the distance between the third and fourth conveying means being adjustable;

a sensor mounted on one of the four parallel conveying means for sensing the location of one of the upstream or downstream parallel conveying means; and an adjusting means in the work cell responsive to the sensor, to adjust the distance between the third and fourth conveying means at least just prior to transfer of the workpiece from the first and second conveying means to the third and fourth conveying means so that said distance is equivalent to the first width.

8. A computer controlled assembly line having multiple conveyors that can independently adjust widths, comprising:

first and second conveyors arranged to pass a printed circuit board from the first conveyor to the second conveyor, each conveyor having a first rail parallel to a second rail;

a scanner to acquire information relating to a size of the printed circuit board;

the first conveyor having an adjusting means, responsive to the information relating to the size of the printed circuit board, for adjusting the distance between the first and second rails to a first width; and one of the first and second conveyors having a sensor responsive to the location of a rail on the other of the first and second conveyors, and having an adjusting means responsive to said sensor, for adjusting the distance between the first and second rails to match the first width at least just prior to transfer of the printed circuit board from the first conveyor to the second conveyor.

* * * * *